United States Patent
Jones

(10) Patent No.: US 7,889,006 B1
(45) Date of Patent: Feb. 15, 2011

(54) DB-LINEAR PROCESS-INDEPENDENT VARIABLE GAIN AMPLIFIER

(75) Inventor: Mark Jones, Kernersville, NC (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 12/565,517

(22) Filed: Sep. 23, 2009

(51) Int. Cl.
*H03F 3/45* (2006.01)

(52) U.S. Cl. .................... 330/254; 330/278

(58) Field of Classification Search ............. 330/254, 330/260, 261, 278
See application file for complete search history.

(56) References Cited

U.S. PATENT DOCUMENTS

| | | | |
|---|---|---|---|
| 6,204,980 B1 * | 3/2001 | Momtaz et al. ............. 360/29 |
| 6,259,321 B1 * | 7/2001 | Song et al. ............. 330/254 |
| 6,636,109 B2 * | 10/2003 | Naka et al. ............. 327/563 |
| 6,870,425 B2 * | 3/2005 | Leifso et al. ............. 330/254 |
| 6,930,549 B2 * | 8/2005 | Kajiwara et al. ............. 330/254 |
| 7,352,238 B2 | 4/2008 | Elwan et al. |
| 7,358,811 B2 | 4/2008 | Koh et al. |
| 7,378,908 B2 * | 5/2008 | Suh et al. ............. 330/254 |
| 2003/0137352 A1 | 7/2003 | Youn et al. |
| 2006/0132237 A1 | 6/2006 | Zochios |

\* cited by examiner

*Primary Examiner*—Henry K Choe
(74) *Attorney, Agent, or Firm*—Howison & Arnott, L.L.P.

(57) ABSTRACT

An amplifier is provided with continuously-variable analog control that exhibits a highly linear gain control curve in db/volts, while preserving high dynamic range, low third order distortion, and low noise. This amplifier has a control mechanism that preserves a varied linear or log linear curve over a wide range and is inherently insensitive to process variations thereby allowing more accurate gain control and higher signal fidelity for amplifying high dynamic range signals.

21 Claims, 5 Drawing Sheets

DB-LINEAR PROCESS-INDEPENDENT VARIABLE GAIN AMPLIFIER

TECHNICAL FIELD

Embodiments of the present invention relate to electrical circuits for variable gain amplifiers (VGAs) and, more particularly, to designs and implementation of a variable gain amplifier that exhibits a substantially linear gain control curve in db/volts.

BACKGROUND

In systems where a variable gain amplifier is needed, there are numerous situations wherein the gain of the variable gain amplifier (VGA) needs to be varied in a logarithmic manner. By varying the gain in a logarithmic manner, the VGA will provide a fairly constant or near linear gain per volt. A linear gain per volt is sometimes called a log linear gain. The inventor notes that known previous VGA circuit designs generally do not provide a smooth log linear curve, but instead provides a curve with bumps or ripples that deviate significantly from a constant slope. The bumps and ripples found in prior circuit designs result in consequences in the overall performance of such prior VGA designs. For example, if one is attempting to amplify an exponentially decaying signal with a smooth log linear amplification curve, then minimal distortion of the amplified signal will result. Conversely, if one uses an approximated log linear curve having bumps and ripples, signal distortion will result at the output of the amplifier.

Another problem produced by bumps and ripples in a log linear curve is that any noise introduced by one or more control lines will modulate the signal in an undesirable manner. The control line noise is directly related to the instantaneous slope of the VGA amplification curve. For example, if you have a gain curve where there is a high slope and a low slope and then a high slope again, the high slope region will exaggerate the control voltage noise at the output of the amplifier.

What is needed is a VGA device that can provide a repeatable, linear gain curve in terms of log linear gain. Furthermore, it would be advantageous to repeatedly provide such a log linear gain curve from a VGA device that does not vary significantly within a predetermined temperature range or within other predetermined environmental variables.

Prior VGA device designs have been found to have one or more disadvantages. Such disadvantages may include having bumps and ripples in the db linear gain, being temperature sensitive over a given temperature range, not being able to provide a repeatable gain on a constant basis or over time or not providing a repeatable output due to the manufacturing process of the device. As such, what is needed is a db linear process independent variable gain amplifier that provides a substantially linear db/volt gain within a given wide operating temperature range, that is insensitive to process variations, and provides a repeatable output or outcome when incorporated into a plurality of devices.

SUMMARY

In view of the limitations and shortcomings of the aforementioned variable gain amplifiers (VGAs) it is apparent that there exists a need for a VGA device that can provide a repeatable, linear gain curve in terms of log linear gain. Furthermore, it would be advantageous to be able to repeatedly provide such a log linear gain curve from a VGA device wherein the device's output is predictable and repeatable within a predetermined wide temperature range and is not affected due to the manufacturing process of the device.

In one embodiment of the invention, an amplifier or attenuator circuit is provided. The amplifier or attenuator circuit comprises a transconductance circuit. The transconductance circuit is controlled, to some degree, by a gate voltage control circuit. The gate voltage control circuit comprises a first MOSFET device having a gate, a source and drain. The gate voltage control circuit further comprises a feedback loop such that the feedback loop comprises a feedback bipolar junction transistor (BJT), a first resistance that is connected in series between an emitter of the feedback transistor and the drain of the first MOSFET, a feedback resistance element in series with a collector of the feedback transistor, and an op amp that receives a feedback voltage which is originated at a node between the feedback resistor and the collector of the feedback transistor. The op amp provides an output that is used as a gate control voltage for a gate of the first MOSFET device. The gate control voltage modulates the transconductance of the first MOSFET and the first resistance. A second MOSFET device is provided such that it is matched to the first MOSFET device. The second MOSFET device is part of the transconductance circuit. The gate of the second MOSFET device is connected to also receive the gate control voltage. The gate control voltage will vary according to the log linear characteristics of the first MOSFET device and its related circuitry.

In another embodiment of a VGA amplifier or attenuator circuit, the gate voltage control circuit provides the gate control voltage to the first MOSFET, which is part of the gate voltage control circuit. And, the transconductive circuit comprises the second MOSFET, which is part of an amplifier that provides a log linear gain output. In yet another embodiment, the second MOSFET is part of an attenuator circuit.

In another embodiment, a variable gain amplifier is provided. The variable gain amplifier comprises a transconductance amplifier circuit having at least a first and second transconductor circuit connected in parallel therein. The first transconductor circuit comprises a first MOSFET while the second transconductor circuit comprises a second MOSFET. The exemplary variable gain amplifier further comprises a first gate voltage control circuit having an output connected to the gate of the MOSFET in a first transconductor circuit and a second gate voltage control circuit having an output connected to the gate of the MOSFET in the second transconductor circuit of the transconductance amplifier. Both the first and the second gate voltage control circuits are similarly designed each having a MOSFET paired or matched to the respective first or second transconductor circuit. Each of the gate voltage control circuits further comprise a feedback loop that includes a feedback transistor, a first resistance connected in series between an emitter of the first feedback transistor and the drain of the gate voltage control circuit's MOSFET, a feedback resistance in series with a collector of the feedback transistor, and a first op amp that receives a feedback voltage that is originated at a node between the feedback resistor and the collector of the feedback transistor. The op amp provides output that is used as a gate control voltage for the respective gate of the MOSFET in the first and second transconductor circuits.

In yet another embodiment, a log linear variable gain amplifier is provided that comprises a plurality of transconductance circuits connected in parallel wherein each transconductance circuit comprises a first MOSFET such that each MOSFET comprises a gate. The exemplary log linear variable gain amplifier further comprises amplifier circuitry having a gain that is determined by the transconductance between two nodes, where the two nodes are connected in parallel with the plurality of transconductor circuits. The log linear variable gain amplifier further comprises a plurality of gate voltage generator circuits wherein each gate voltage generator circuit comprises a control voltage input, a second MOSFET and a feedback loop that includes the second MOSFET. The feedback loop is adapted to produce a gate control voltage output, which produces a log linear transconductance variation of the second MOSFET for or over a predetermined control voltage range. The output of each gate voltage generator circuit constitutes a gate control voltage connected to the gate of a different first MOSFET in the plurality of parallel connected transconductance circuits. A log linear transconductance variation is a transconductance v. a control signal (i.e., voltage or current) curve of a constant slope if the transconductance is measured in dB.

BRIEF DESCRIPTION OF THE DRAWINGS

For a more complete understanding, reference is now made to the following description taken in conjunction with the accompanying Drawings in which.

DETAILED DESCRIPTION

Figure 1:
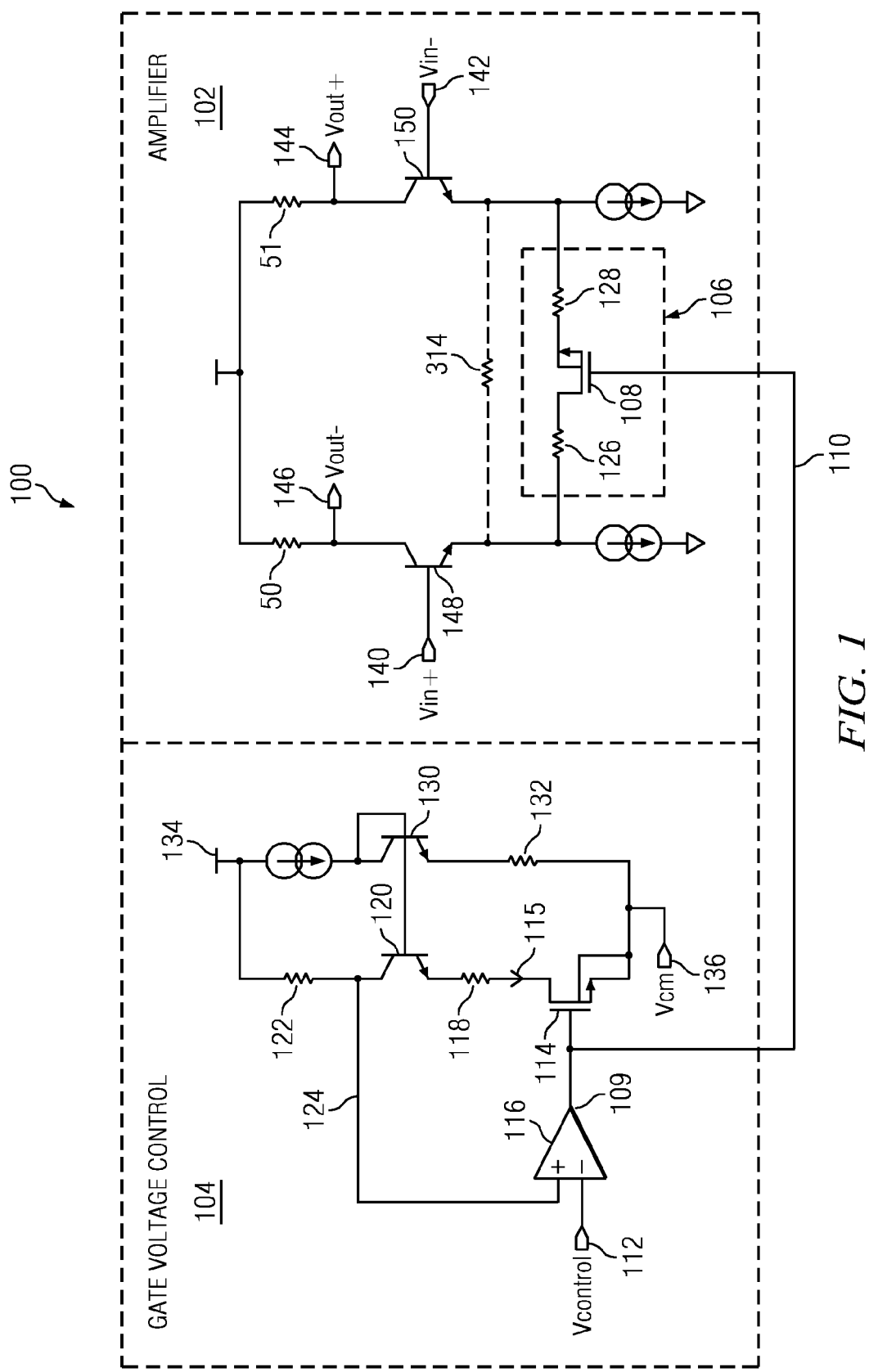
FIG. 1 is a circuit diagram of an exemplary variable gain amplifier.

Referring now to the drawings, wherein like reference numbers are used herein to designate like elements throughout, the various views and embodiments of a db-linear process-independent variable gain amplifiers are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following description of examples of possible embodiments.

Embodiments of the invention provide an amplifier with a continuously-variable analog control that exhibits a highly linear gain control curve in db/volts, while preserving high dynamic range, low third-order distortion, and low noise. Normally VGA gain curves show a noticeable amount of deviation from a linear curve (in terms of voltage gain in db versus their control function). Embodiments of the invention provide an amplifier control mechanism that preserves a linear curve over a wide range. The linear curve of an exemplary embodiment is inherently insensitive to process variations thereby allowing for more accurate gain control and higher signal fidelity when amplifying high dynamic range signals.

Embodiments further allow for good part-to-part gain control without post production resistor trimming or external gain normalization. Embodiments of the present invention may be used in a wide variety of devices that need VGA or continuously variable attenuator circuits including, without limitation, medical ultrasound devices, point to point communications systems, cellular communications, and sensor signal conditioning circuitry.

Referring now to FIG. 1, an embodiment of an exemplary VGA 100 is shown having an amplifier circuit 102 on the right and a gate voltage control circuit 104 on the left side of the figure. The amplifier 102 is constructed such that its voltage gain is determined by the product of the load resistances of resistors 50, 51 and the transconductance between the emitters of transistor devices 148 and 150. In some embodiments, the transconductance between the emitters of transistor devices 148 and 150 is equal to the transconductance of the transconductance circuit 106. The variable Transconductor Transistor (TT) 108, within the transconductance circuit 106, is a MOSFET that is operated in its triode region and its resistance is modified by a gate control voltage 110.

The gate control voltage 110, for the TT MOSFET 108, is provided by the gate voltage control circuit 104. The gate voltage control circuit 104 creates a DC gate modulating voltage (the gate control voltage 110) in response to a received input control voltage (Vcontrol) 112. The gate voltage control circuit 104 includes a replica MOSFET 114, which is a replica or a size-scaled replica of the TT MOSFET 108 found in the amplifier circuit 102. Such replica MOSFETS are known to be easily created in the manufacturing process. The gate control voltage 110 of the replica MOSFET transistor 114 is varied to satisfy feedback conditions of the circuit loop comprised of the op amp 116, the replica MOSFET 114, the resistor 118, the bipolar junction transistor 120 and a feedback resistor or feedback element 122. Feedback elements other than feedback resistor or feedback element 122 may be incorporated into embodiments. For example, an alternate feedback element 122 may comprise a current mirror or an electrical connection between the collector of the transistor 120 and the op amp 116 in order to provide current feedback. This means that the $V_{gs}$ (voltage from gate to source) of the replica MOSFET transistor 114 is varied in response to the input control voltage signal 112 such that a linear current is forced through transistor 120. Given the log/linear behavior of the collector current in response to $V_{be}$ (voltage from base to emitter) of transistor 120, the impedance of the replica MOSFET transistor 114 plus the series resistor 118 ($Z=R_{ds\ (of\ transistor\ 114)}+R118$) varies closely to a reciprocal log/linear curve for the MOSFET. Unlike other types of transistors, a bipolar junction transistor provides the needed log linear behavior. Thus, when the same gate control voltage 110, which is used at the gate of replica MOSFET transistor 114, is used at the gate of the second replica MOSFET, the TT MOSFET transistor 108 in the amplifier circuit 102, a nearly log/linear gain curve results.

This novel technique of gain control scaling is manufacturing process independent since the replica MOSFET transistors 114 and 108 can be easily made to match (or match with size scaling) during manufacturing on silicon.

To provide more detail about the gate voltage control circuit 104, the functionality of the gate voltage control circuit 104 revolves around the feedback loop, which controls the gate voltage 110 of the replica MOSFET 114, which, by the way, may be an NMOS device. While operating, the replica MOSFET 114 is kept in the triode region and its impedance is varied by the gate to source voltage. When the impedance of the replica MOSFET transistor 114 is varied, the current 115 flowing through the transistor 114 is also changed. That current 115 also flows through feedback transistor 120 and feedback resistor or feedback element 122, which affects a feedback voltage 124. The feedback voltage 124 is fed to the op amp 116 as shown. Knowing that the feedback resistor or feedback element 122 responds in a linear fashion to a change in current therethrough, then the feedback voltage 124 via the op amp 116 creates an output 109 which is a transconductance of replica MOSFET transistor 114 and the resistor 118, which will vary in a near log linear relationship with the TT MOSFET 108 of the amplifier circuit 102. This log linear relationship is based on the fact that the replica MOSFET transistors 108 and 114 are scaled devices and that the resistors 126 and 128, in the transconductance circuit 106, will scale to the resistor 118. The output 109 of the op amp 116 is the output of the gate voltage control circuit 104.

Since matched or replica devices TT MOSFET 108 and replica MOSFET 114 are being used in a feedback loop, variations due to temperature and processing are substantially eliminated. Furthermore, since a variable transconductor is being used in series with an emitter of an NPN transistor 120, the circuit is taking advantage of the voltage current relationship of the transistor device such that a log linear relationship is being created. Thus the log linear characteristics of the NPN transistor 120 along with the device matching of the MOSFET transistors 114 and 108 in the gate voltage control circuit 104 and in the amplifier 102 achieve the ability to be substantially immune to process variations and temperature variations in the resulting exemplary circuit.

Still referring to FIG. 1 and in particular to the gate voltage control circuit 104, the combination of the NPN transistor 120 and the NPN transistor 130 create a voltage bias such that a proper electromotive force (EMF) is provided to the base of transistor 120. The EMF, which is produced by the series combination of transistor 130 and resistor 132, should be low enough such that the MOSFET transistor 114 is kept in the triode region at all times during operation. Essentially, MOSFET transistor 114 should not go into saturation. If MOSFET transistor 114 goes into saturation, the accuracy of the circuitry may be lost.

The supply voltage 134 may be a voltage ranging from about 1 volt to 10 volts, or in various embodiments, voltages that are much higher in the 11 to about 30 volt range. A common mode voltage 136 is connected to the source voltage of MOSFET transistor 114. The common mode voltage 136 is used to duplicate the common mode voltage found at the replica TT MOSFET 108 in the amplifier circuit 102 such that both devices may operate at the same common mode voltage wherein the DC source voltage of both devices is the same.

It should be understood that the MOSFET transistors 108 and 114 are matched, but in matching these transistors it does not mean that they are necessarily the same size transistor. In various embodiments, these two transistors 108 and 114 may be scaled in impedance such that they are proportional to one another. Their impedance may be scaled by a fixed or predetermined factor when they are manufactured. Whatever scaling factor is used to scale the two MOSFET transistors 108 and 114, the same scaling factor should also be used in scaling the relationship between the resistor 118 and the two transconductance resistors 126 and 128.

The indicated connections $V_{IN}+$ 140 and $V_{IN}-$ 142 indicate where external signal inputs may be connected to the input(s) of the amplifier circuit 102. Likewise, the $V_{OUT}+$ 144 and $V_{OUT}-$ 146 nodes are indicative of the potential output connections to an external circuit from the exemplary amplifier circuitry 102. The Vcontrol 112 will generally come from an external voltage control circuit but may, in some embodiments, come from on-board or on chip circuitry associated with exemplary embodiments of the invention.

Referring again to the exemplary amplifier circuitry 102, this amplifier circuit may be compared with a basic differential pair with variable transconductance. As the transconductance about the NMOS device 108 is varied, the impedance associated with the emitters of the transistors 148 and 150 is changed thereby modulating the gain of the amplifier 102. Other embodiments of the invention may use a more advanced amplifier that may include a feedback circuit to help linearize the voltages on the emitters of the transistors 148 and 150 in order to establish an even more ideal gain characteristic in the circuit. In the exemplary amplifier 102 shown, the gain of the amplifier depends almost solely on the transconductance circuit 106. As the voltage on the gate of the NMOS transistor 108 is increased, the gain of the amplifier goes up and as the voltage of the gate of the transistor 108 is decreased, the gain of the overall amplifier 102 decreases. Said another way, as the impedance across the transistor 108 increases, the gain of the amplifier 102 decreases and as the impedance across the transistor 108 decreases, the gain of the amplifier 102 increases. At some point the maximum gain limit will be reached wherein the impedance of the NMOS transistor 108 will look very small compared to the resistances of resistors 128 and 126 within the transconductance circuit 106.

Figure 2:
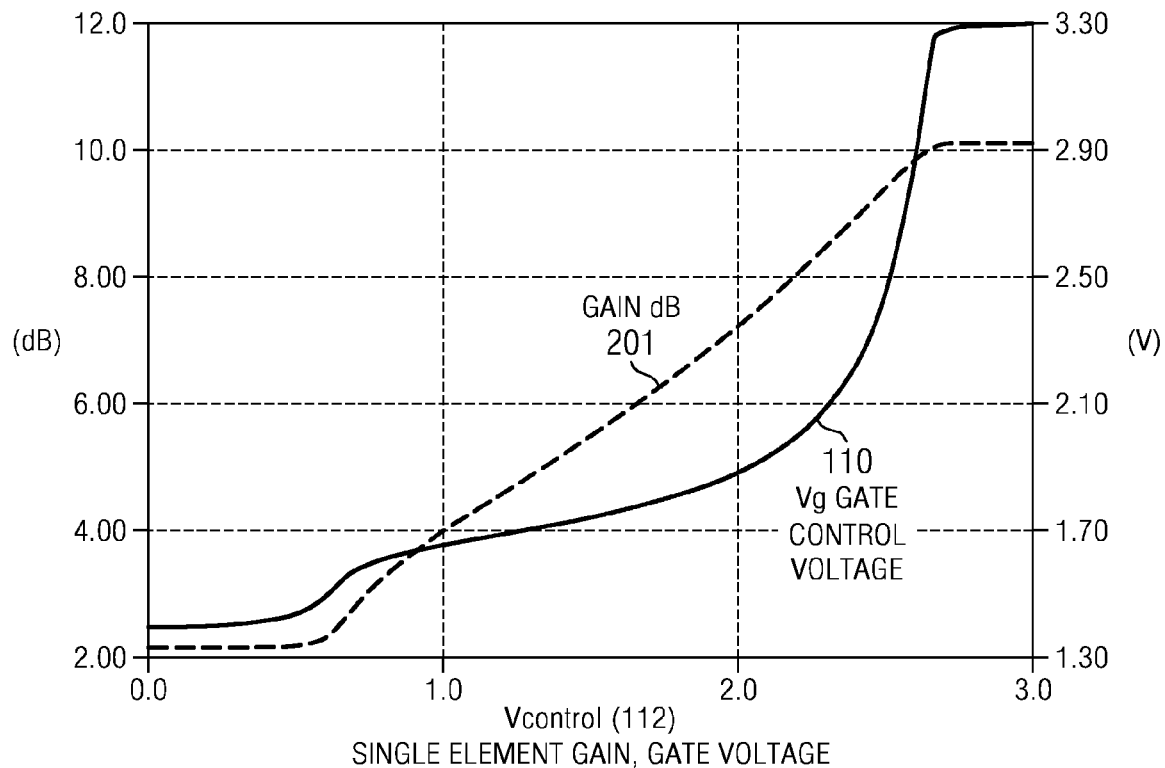
FIG. 2 is a graph showing the linear gain per volt curve as well as the gate control voltage curve for an embodiment of the invention.

Referring now to FIG. 2, a single transconductance section response versus control voltage input graph is depicted for an exemplary device such as the one shown in FIG. 1. On the X axis of FIG. 2 is the Vcontrol voltage 112 from FIG. 1. The gate control voltage 110 is provided to the gates of the NMOS matched pair transistors 108 and 114. The gate control voltage 110 is produced by the op amp feedback circuit of the exemplary gate voltage control circuit 104. The gain curve 201 is the gain in db that is produced by the exemplary amplifier circuit 102 having a single transconductance circuit 106.

FIG. 2 shows that an exemplary embodiment produces a substantially linear gain curve and relationship between two predetermined or designated Vcontrol voltages (in this example between about 0.5 volts and 2.5 volts). The end points of this linear gain are chosen by predetermined design of the transconductance portion 106 of an exemplary amplifier 102. The ultimate goal is to maintain a linear db per voltage curve between two designated Vcontrol 112 voltages.

In additional embodiments of the invention, a broader or longer linear gain amplifier can be achieved using multiple stepped transconductance circuit segments in association with one or more amplifier circuits. The stepped transconductance circuits 304A-304N may be connected in parallel between the emitters of transistors 306 and 308 and/or each may be considered a substantially discrete circuit.

Figure 3:
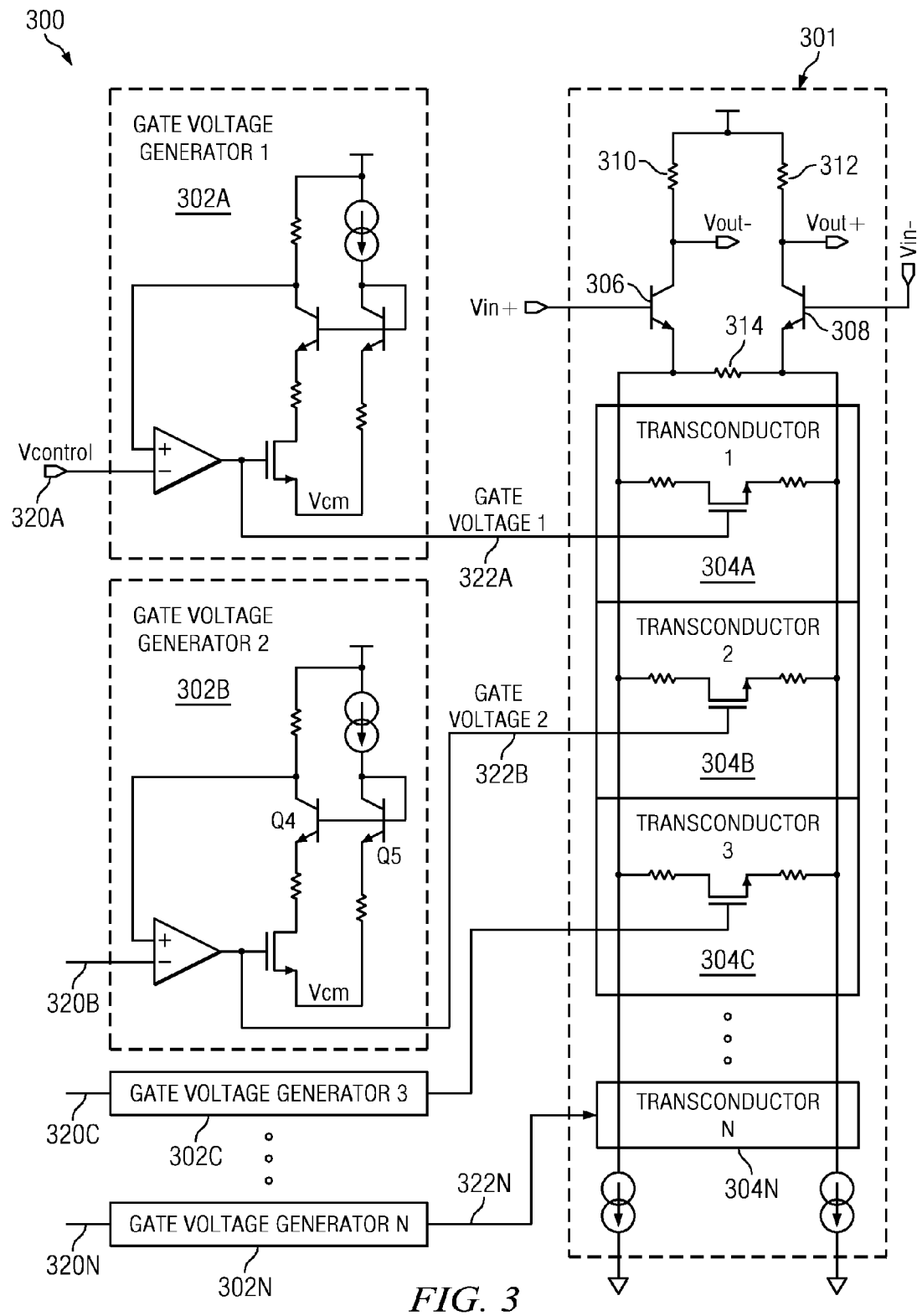
FIG. 3 depicts a circuit diagram comprising a multiple element variable gain amplifier in accordance with the invention.

Referring now to FIG. 3, an exemplary embodiment 300 is shown utilizing a plurality of gate voltage generator circuits 302A through 302N respectively in conjunction with a plurality of transconductor circuit sections (304A through 304N). It was determined that using multiple transconductance circuit sections 304A, 304B, 304C . . . 304N, in parallel along with multiple gate voltage generators 302A, 302B, 302C . . . 302N, such that each gate voltage generator and its associated respective transconductance circuit are stepped in their signal response, i.e., non-overlapping in their signal response, to establish a very wide range of achievable gain control. By non-overlapping in signal response, it is meant that as when one gate voltage generator/transconductor circuit combination reaches a maximum or minimum point in its linear gain curve then it turns substantially off and another gate voltage generator/transconductor circuit combination that is adjacent in signal response will turn on and take over the control of the impedance between the amplifier's transistors 306 and 308. Thus, the gain of the overall amplification circuitry can be held in a very linear manner for a wide range of gains.

Adding additional transconductor circuits 304 as sequential circuit segments essentially creates the several transconductor circuit stages. This technique has been shown and proven in embodiments of the invention to improve the part-to-part gain matching of any specific gain setting in a plurality of manufactured parts or devices.

As discussed earlier, the gain of the staged or stepped amplifier transconductor portion 301 of this circuit is based on the product of collector resistances 310 and 312 and the transconductance provided by the active transconductor circuit 304A-304N seen between the emitters of the differential pair of transistors 306 and 308. The total transconductance is the sum of the individual transconductance values for the Nth stage ($G_n$) for each transconductor element 1-N. Each transconductor element is in turn controlled by a separate gate voltage.

An optional resistor 314 may be included in an exemplary amplifier. This resistor between the two emitters of the differential pair of transistors may also be similarly used in the exemplary amplifier circuit 102 from FIG. 1. Resistor 314 provides a lowest limit to the gain of the overall exemplary differential pair staged amplifier circuit 300. Without resistor 314 the gain may go down to zero gain or to minus infinity dB. It should be noted that the FIG. 2 graph is provided with an optional resistor 314 in the exemplary amplifier circuit 102. As such, one would understand that although resistor 314 limits the lower or lowest gain of the overall amplifier, it is not an absolute necessary element of the circuit. As such, a circuit design may or may not use or incorporate such a resistor or impedance into the circuit in various embodiments of the invention.

Although each of the gate voltage generator circuits 302A, 302B, 302C . . . 302N are similar in design, the values of the elements within the individual gate voltage generator circuits will change in accordance with the portion, section or segment of the gain curve or the section, portion or section of the gate control voltage 322 that the gate voltage generator circuit is designed for in association with its associated transconductor circuit 304A through 304N. Not specifically shown in FIG. 3 is the circuitry which allows for the sectioning or stepping of the control voltages 320A, 320B, 320C through 320N. Regardless, such control voltages 320A through 320N may be provided by various types of circuits. For example, there may be a voltage control circuit having staggered, staged or sectioned DC offset voltages or a DC shift may be provided in the op amps by utilizing an additional resistor or resistance circuit going into a summing point. As such, there are many ways to provide stepped or offset control voltages for the op amp within each exemplary gate voltage generator circuit 302a through 302n.

Figure 5:
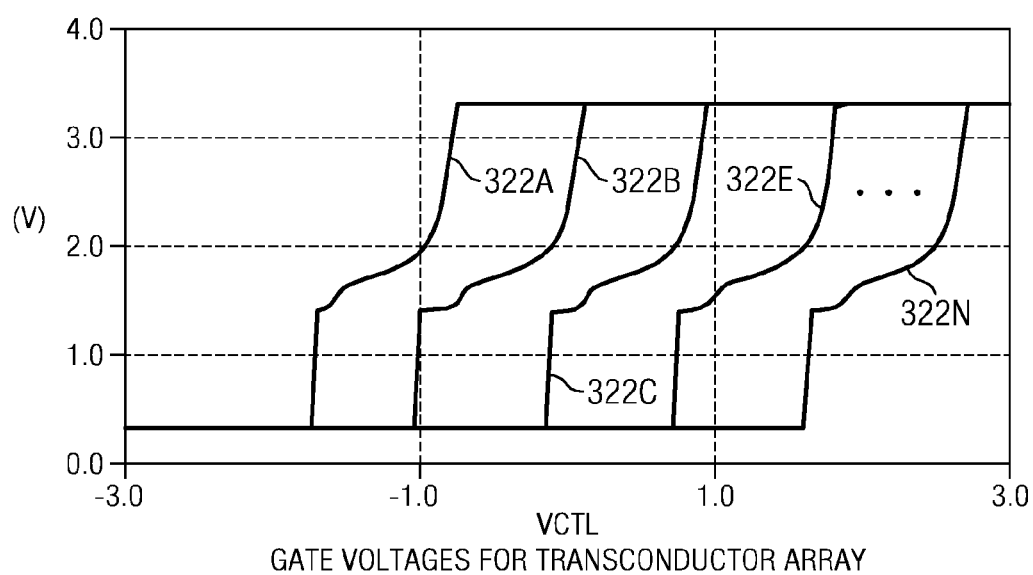
FIG. 5 depicts a graph showing the gate voltages of a multiple element transconductor array in accordance with an embodiment of the invention.

Exemplary embodiments may provide gate voltage generator circuits such that the gate voltage generator circuits are staged or stepped so that as the control voltage range is traversed, each one of the gate voltage generators goes from a minimum to a maximum during a different predetermined fraction of the total sweep voltage of the input control voltage 320. Further, a first gate voltage generator 302A operates from some minimum voltage control voltage to some fraction or portion of the total voltage control voltage such that when the first gate voltage generator 302A reaches its maximum voltage a second gate voltage generator 302B begins sweeping, for example, from where the first gate voltage generator 302A stopped and continue through a second predetermined portion of the overall voltage control sweep voltage range 320. In other words, in an embodiment each successive gate voltage generator 302A through 302N responds to a different portion (overlapping or non-overlapping) of the input control voltage 320 to stagger the gate voltage 322A-N curves. If the control voltage 320 is swept from a minimum voltage to a maximum voltage the gate voltage 322A of the first transconductor circuit 304A will begin sweeping to provide a log linear gain between the minimum control voltage and a portion of the overall control voltage 320. When the control voltage 320A (and as a result the gate voltage 322A) reach the end of its sweep range, the gate voltage 322B provided by the second gate voltage generator 302B begins its sweep based on a next or a second portion or segment of the overall control voltage range 320B as can be seen in FIG. 5, and explained below. Thus, embodiments of the invention provide multiple transconductor sections such that one of the transconductor sections 304A through 304N, in conjunction with its associated gate voltage generator 302A through 302N is operated such that only one transconductance control voltage 322A-322N is in the mid-region of a transconductor circuit's associated gain at any time; meanwhile, the remaining gate or transconductance control voltages 322A through 322N are operating at their positive or negative rail (max or min voltage). In operating at their negative rail, their associated NPN transistor within the respective transconductor circuit is off, thereby maximizing the impedance of the other transconductor circuits to essentially infinity. Conversely, when the gate control voltage of the NMOS transistors within the other transconductance circuits 304A through 304N are at their maximum rail, their impedance is minimized making the overall impedance of each transconductor circuit equal to the addition of the two resistors or the other resistance therein. This novel design has advantages in keeping the gain curve at a constant slope near the minimum and maximum gain of each transconductor section 304A through 304N thereby resulting in a near linear gain over the full intended range of an exemplary amplifier.

Figure 4:
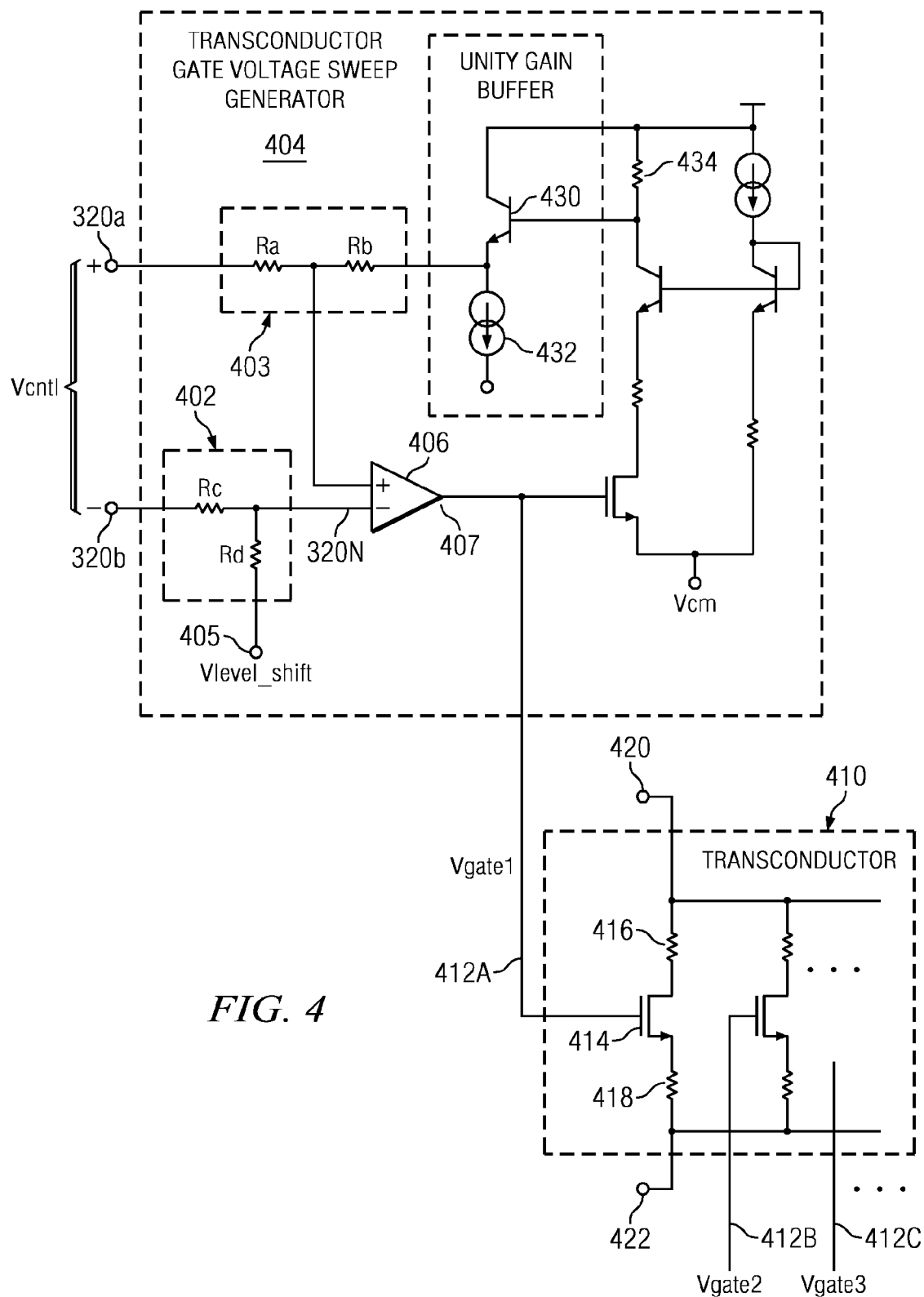
FIG. 4 depicts a circuit diagram of an exemplary transconductor gate voltage sweep generator in accordance with an embodiment of the invention.

FIG. 4 depicts another exemplary gate voltage generator circuit 404 having control voltage inputs 320a and 320b. The control voltage inputs 320a and 320b are amplified by op amp 406 as defined by gain setting resistors Ra, Rb, Rc, and Rd. The resulting gate control voltage 412a can be shifted or offset by applying a DC voltage to input (Vlevel shift) 405. By applying a different DC voltage to the level shifting input 405 of different gate voltage sweep generators 404, it is possible to product different offsets for a series of exemplary gate voltage sweep generators 404.

FIG. 5 is a chart that depicts the staged or stepped gate or transconductance control voltages 322A through 322N. Each of the gate control voltages may lie graphically next to each other, but each does not overlap in the active regions of their associated transconductor circuit's NPN transistor.

Referring back to FIG. 4, the gate voltage generator 404 is depicted. Here a practical example of taking a differential control input 320a and 320b along with an individual DC level shifting voltage 405 to obtain the proper offset voltage for the op amp 406 in the gate voltage control circuit. Furthermore, FIG. 4 depicts a more general embodiment of various parallel transconductor circuits 410 such that each transconductor circuit is provided a gate voltage 412A, 412B, 412C through 412N (not specifically shown). Furthermore, each transconductor circuit within the plurality of transconductors 410 comprises an NMOS device 414 with resistors or impedance devices 416 and 418 connected in series with the NMOS devices source and drain. Each individual transconductor circuit is connected in parallel within the transconductor circuitry 410. Nodes 420 and 422 can be connected to a wide variety of transistor or amplifier circuits whose signal gain is based on the transconductance between the two nodes 420 and 422.

The voltage divider circuits 402 and 403 define the fraction or portion of the overall gain that the associated transconductor circuitry 410 is designed for. In other words, the ratio of the voltage divider circuits 402 and 403 define the portion of the gain slope that the individual gate voltage control circuit and associated amplifier circuit control. Thus, if there is overlap between two contiguous transconductor gate voltage sweep generators 404 the gain of the resistors in divider circuit 403 or the gain of the voltage divider circuit 402 can be adjusted so that there is no overlap. Conversely, if there is a dead spot between the two gain slopes of two contiguous circuits such gains of the voltage divider circuits in either voltage divider circuit 402 or voltage divider circuit 403 can be adjusted such that the gap is eliminated.

Still referring to FIG. 4, the exemplary gate voltage generator 404 when compared with the previously discussed gate voltage control circuit 104 includes an additional NPN transistor 430 along with a current source 432 connected to its emitter. The combination of the NPN transistor 430 and the current source 432 is essentially a unity gain buffer that drives the current necessary for the feedback voltage divider circuit 403. In other embodiments, the combination of the transistor 430 and current source 432 could be replaced with a buffer circuit or unity gain buffer that protects from overloading the collector and feedback resistor 434.

Figure 6:
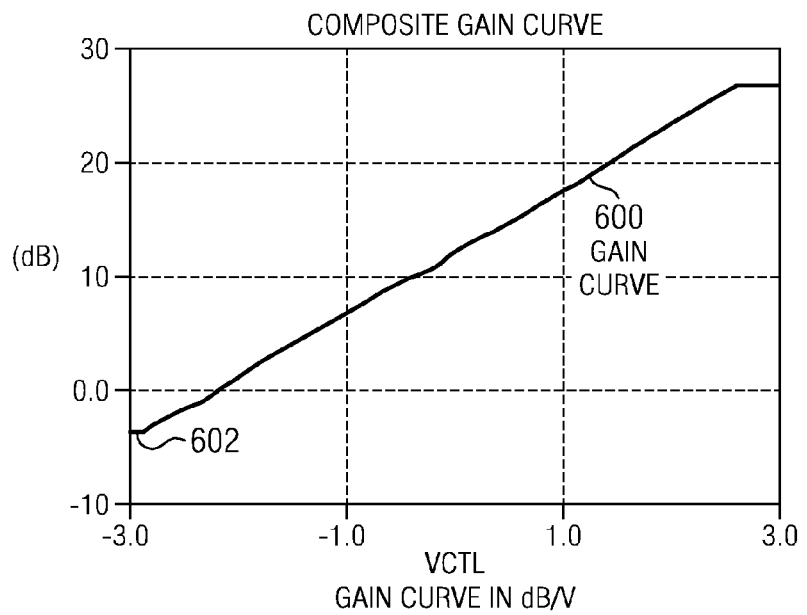
FIG. 6 depicts a graph of a substantially linear, repeatable and temperature independent gain curve in db/volts of an exemplary embodiment of the invention.

FIG. 6 depicts a graph of a gain curve of an exemplary circuit comprising the multiple transconductor gate voltage sections of FIG. 5. It should be noted that an exemplary embodiment may operate in a lower voltage range, for example the −2 volt to −3 volt range, of the control voltage using a separate circuit, which may be an attenuator circuit that will be discussed herein below. The gain curve 600 of FIG. 6 shows, from about −2 volts to about 2.8 volts, the composite log linear gain curve associated with the gate voltage curves of FIG. 5. The multiple transconductor sections of the embodiment perform synergistically to provide a clean substantially linear gain curve 600. The level gain portion 602 of the curve 600 starting from −3 volts to about −2 volts of the control voltage is controlled by an attenuator circuit, which precedes this exemplary amplifier. The attenuator circuit has its own gain control voltage for the voltage control range of −3 to −2 volts. One reason for an embodiment of the invention to use an attenuator circuit for the range of −2 volts to −3 volts is to prevent overdriving of the amplifier transistors at the lowest end of the gain curve.

Figure 7:
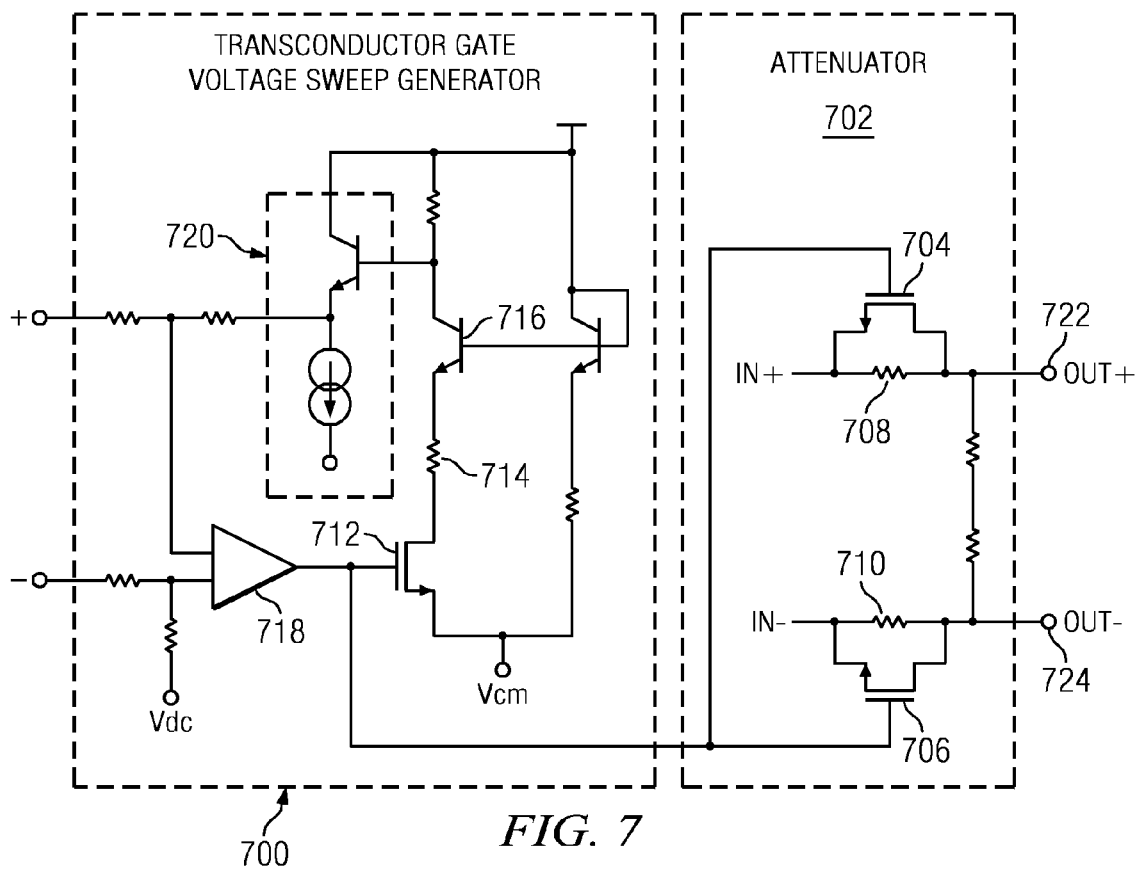
FIG. 7 depicts yet another circuit diagram utilizing an embodiment of the invention in a transconductor gate voltage sweep generator circuit that incorporates attenuator circuitry.

Referring to FIG. 7, an exemplary gate voltage sweep generator control circuit 700, which is similar to the gate voltage control circuit of FIG. 4 is shown along with a transconductance attenuator circuit 702 having loss devices 704 and 706, each in parallel with an attenuation device 708 and 710. In this embodiment, the attenuator devices 704, 706 are both used as variable resistors but could also be other devices with or without a reactance. The MOS devices 704 and 706 may also be placed in series instead of parallel with their respective attenuation devices 708 and 710, respectively. What is important here is that the gate control voltage for each of the MOS devices 704 and 706 is created using a feedback circuit using an NMOS device 712 in series with a resistor 714 that is connected in series with the emitter of a BJT transistor 716 wherein the gate voltage of the NMOS device 712 is modulated by a feedback circuit via amplifier 718 and the unity gain buffer 720. Thus, the core circuit of the transconductor gate voltage sweep generator 700 can be used to generate a gate voltage of a transconductor based amplifier as shown in previous figures and also may be used to generate a gate voltage of an NMOS or PMOS device in an attenuator circuit. The gate voltage of the MOS devices 704 and 706 is varied to adjust the impedance or resistance of the attenuation devices, in this case resistors 708 and 710, respectively. As such, the gain of the attenuator can be controlled and steadily adjusted. For example, the gain curve portion 602 shown in FIG. 6 can be adjusted. Thus, by combining multiple exemplary gate voltage generator circuits with multiple transconductor and attenuator circuits, embodiments of the invention can extend the amplifier gain curve in a near linear fashion for the amplifier outputs of $V_{OUT+}$ and $V_{OUT-}$. To say it another way, embodiments of the invention expand the useful log linear range of an amplifier's gain by combining multiple gain segments, each comprising a gate voltage generator and an amplifier transconductor circuit that provide a linear gain curve over a segment of a predetermined sweep range that can not be produced as accurately using a single stage amplifier. Furthermore, an exemplary gate voltage generator circuit provides a stable and predictable technique for providing the appropriate gate voltage to the NMOS devices in the respective transconductor amplifier portions of the embodiment.

In some embodiments, the attenuator circuit 702, the $V_{OUT+}$ 722 and $V_{OUT-}$ 724 outputs are connected to the $V_{IN+}$ 140 and $V_{IN-}$ 142 inputs of amplifier circuit 102 (i.e., cascaded). The attenuator circuit may be placed in cascade either before or after an amplifier stage. The attenuation circuit produces the flat gain curve 602 in FIG. 6, which smoothly matches with the constant slope of the amplifier's gain curve. As such, the attenuator 702 in combination with the transconductor gate voltage sweep generator 700 may be a first element in a cascade device wherein the plurality of transconductor gate voltage sweep generators and transconductor amplifier stages would be the next section of the cascade. In other embodiments, the attenuator portion is not necessary. Furthermore, in yet other embodiments, there may be a plurality of attenuator stages used to get a very wide range log linear amplification circuit. Thus, it should be understood that an exemplary transconductor gate voltage sweep generator may be used to control either an amplifier or an attenuator device as described herein. Furthermore, in other embodiments, an attenuator, similar to attenuator circuit 702, may be cascaded after the amplifier circuit.

Additionally, embodiments of the invention can be used to drive a bipolar transconductor amplifier as well as an Operational Transconductance Amplifier (OTA) where an output current is based on a predetermined transconductance range. The voltage sweep generator can drive a MOS based amplifier. An op amp based transconductance amplifier could also be driven by varying the ratio of two impedances using a changing gate voltage of a transistor in parallel with another resistor in the feedback or feed forward portion of an op amp circuit. As such, embodiments of the invention can be utilized where transconductance of a transistor is used to vary the gain, voltage, current or impedance of another circuit and one wants to be able to control the transconductance in a linear manner.

It will be appreciated by those skilled in the art having the benefit of this disclosure that this dB-linear process-independent variable gain amplifier provides a a controlled gate voltage via a feedback circuit such that the controlled gate voltage can control another circuit to produce a linear output over a predetermined range. The linear outputs over various predetermined ranges can be added in a step wise manner such that the linear range is extended over a larger total range as individual transconductance controlled circuits have their gate voltage controlled by embodiments of the present invention. The non-linear gate control voltage output of the gate voltage control circuit produces a log linear gain over a predetermined range in a secondary device such as an amplifier, attenuator, voltage controlled current source and various other transconductance based devices. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A gate voltage control circuit comprising:
 a first MOSFET having a gate, a source and a drain;
 a feedback loop comprising:
  a feedback transistor;
  a first resistance being connected in series between an emitter of the feedback transistor and the drain of the first MOSFET;
  a feedback resistor configured to provide a linear current at a collector of the feedback transistor, the feedback element connected with the collector of the feedback transistor; and
  an op amp that receives a feedback voltage originated at a node between the feedback resistor and the collector of the feedback transistor, the op amp provides an output that is used as a gate control voltage, the gate control voltage is received at the gate of the first MOSFET, the gate control voltage modulates the transconductance of the combination of first MOSFET and the first resistance; and
 a second MOSFET having a gate, a source and a drain, the second MOSFET matched to the first MOSFET, the gate of the second MOSFET connected to receive the gate control voltage.

2. The gate voltage control circuit of claim 1, wherein the gate control voltage produces a drain to source transconductance in a near log linear relationship of the second MOSFET device.

3. The gate voltage control circuit of claim 1, wherein the second MOSFET is part of a transconductive circuit.

4. The gate voltage control circuit of claim 3, wherein the transconductive circuit is part of an amplifier that provides a log linear gain output relative to a control voltage, the gate voltage control circuit being adapted to receive the control voltage, the control voltage having a predetermined range.

5. The gate voltage control circuit of claim 3, wherein the transconductive circuit is part of an attenuator circuit.

6. A variable gain amplifier comprising:
 a transconductance amplifier, the transconductance amplifier comprising:
  a first transconductor circuit comprising a first MOSFET; and
  a second transconductor circuit comprising a second MOSFET, the second transconductor circuit being connected in parallel with the first transconductor circuit;
 a first gate voltage control circuit having a first gate control voltage output connected to a gate of the first MOSFET, the first gate voltage control circuit comprising:
  a third MOSFET having a gate, a source and a drain;
  a first feedback loop comprising:
   a first feedback transistor;
   a first resistance being connected in series between an emitter of the first feedback transistor and the drain of the third MOSFET;
   a first feedback resistor connected in series with a collector of the feedback transistor; and
   a first op amp that receives a first feedback voltage originated at a first node between the first feedback resistor and the collector of the first feedback transistor, the first op amp provides a first output that is used as a first gate control voltage, the first gate control voltage received at a gate of the first MOSFET, the first gate control voltage connected to control a transconductance of the combination of the third MOSFET and the first resistance; and
 a second gate voltage control circuit having a second gate control voltage output connected to the base of the second MOSFET, the second gate voltage control circuit comprising:
  a fourth MOSFET having a gate, a source and a drain; and
  a second feedback loop comprising:
   a second feedback transistor;
   a second resistance being connected in series between an emitter of the second feedback transistor and the drain of the fourth MOSFET;
   a second feedback element connected in series with a collector of the feedback transistor; and
   a second op amp that receives a second feedback voltage originated at a second node between the second feedback resistor and the collector of the second feedback transistor, the second op amp provides a second output that is used as a second gate control voltage, the second gate control voltage is received at a gate of the second MOSFET, the second gate control voltage connected to control a transconductance of the combination of the fourth MOSFET and the second resistance.

7. The variable gain amplifier of claim 6, wherein the first feedback transistor is a bipolar junction transistor.

8. The variable gain amplifier of claim 6, wherein the first gate control voltage is received at the gate of the third MOSFET, and wherein the second gate control voltage is received at the fourth MOSFET.

9. The variable gain amplifier of claim 6, wherein the first MOSFET and the third MOSFET are matched MOSFET devices.

10. The variable gain amplifier of claim 9, wherein the second MOSFET and the fourth MOSFET are matched MOSFET devices.

11. The variable gain amplifier of claim 6, further comprising a control voltage input for receiving a control voltage, the control voltage having a predetermined voltage range;
 the first gate control voltage is a voltage curve for a first portion of the predetermined voltage range and either a maximum or a minimum voltage for other portions of the predetermined voltage range; and
 the second gate control voltage is a voltage curve for a second portion of the predetermined voltage range and either the maximum or the minimum voltage for other portions of the predetermined voltage range.

12. The variable gain amplifier of claim 6, further comprising a control voltage input for receiving a control voltage, the control voltage having a predetermined voltage range;

the first gate control voltage, being received at the gate of the first MOSFET, enables the transconductance amplifier to provide a first log linear gain curve for a first portion of the predetermined voltage range;

the second gate control voltage, being received at the gate of the second MOSFET, enables the transconductance amplifier to provide a second log linear gain curve for a second portion of the predetermined voltage range.

13. The variable gain amplifier of claim 12, wherein the first log linear gain curve and the second log linear gain curve have substantially the same slope and are substantially linear.

14. The variable amplifier of claim 12, wherein the first log linear gain curve and the second log linear gain curve do not overlap.

15. The variable amplifier of claim 6, further comprising an attenuator circuit in a cascade connection with the transconductance amplifier.

16. The variable amplifier of claim 6, wherein the first feedback loop further comprises a first buffer circuit between the first node and the first op amp.

17. A log linear variable gain amplifier comprising:

a plurality of transconductance circuits connected in parallel, each transconductance circuit comprising a first MOSFET, each first MOSFET comprising a gate;

amplifier circuitry having a gain determined by the transconductance between two nodes, the two nodes being connected in parallel with the plurality of transconductor circuits; and a plurality of gate voltage generator circuits, each gate voltage generator circuit comprising:

a control voltage input for receiving a control voltage, the control voltage having a control voltage range;

a second MOSFET, each second MOSFET being matched to a different first MOSFET in the plurality of transconductance circuits; and a feedback loop that includes the second MOSFET, the feedback loop being adapted to produce a gate control voltage output that is a log linear transconductance variation of the second MOSFET over the control voltage range, the gate control voltage output being connected to the gate the matched first MOSFET such that the amplifier circuitry produces a log linear gain for a predetermined portion of the control voltage range.

18. The log linear variable gain amplifier of claim 17, wherein the feedback loop of each gate voltage generator circuit is adapted to produce a gate control voltage output that is a log linear transconductance variation of the second MOSFET of a portion of the control voltage range.

19. The log linear variable gain amplifier of claim 17, further comprising an attenuator circuit in a cascade connection with an input of the amplifier circuitry.

20. The log linear variable gain amplifier of claim 17, wherein the feedback loop of each gate voltage generator circuit further comprises:

a feedback transistor;

a first resistance connected in series between an emitter of the feedback transistor and a drain of the second MOSFET;

a feedback resistor connected in series with a collector of the feedback transistor; and an op amp that receives feedback voltage originated at a feedback node between the feedback resistor and the collector of the feedback transistor, the op amp provides an output that is the gate control voltage.

21. The log linear variable gain amplifier of claim 20, wherein the feedback loop of each gate voltage generator circuit further comprises a first buffer circuit between the feedback node and the op amp.

* * * * *